United States Patent
Xu et al.

(10) Patent No.: US 11,215,652 B2
(45) Date of Patent: Jan. 4, 2022

(54) METHOD FOR OBTAINING A CONTACT RESISTANCE OF A PLANAR DEVICE

(71) Applicant: INSTITUTE OF MICROELECTRONICS, CHINESE ACADEMY OF SCIENCES, Beijing (CN)

(72) Inventors: Guangwei Xu, Beijing (CN); Zhiheng Han, Beijing (CN); Wei Wang, Beijing (CN); Congyan Lu, Beijing (CN); Lingfei Wang, Beijing (CN); Ling Li, Beijing (CN); Ming Liu, Beijing (CN)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 804 days.

(21) Appl. No.: 16/065,582

(22) PCT Filed: Dec. 25, 2015

(86) PCT No.: PCT/CN2015/098834
§ 371 (c)(1),
(2) Date: Jun. 22, 2018

(87) PCT Pub. No.: WO2017/107172
PCT Pub. Date: Jun. 29, 2017

(65) Prior Publication Data
US 2021/0165027 A1 Jun. 3, 2021

(51) Int. Cl.
*G01R 27/08* (2006.01)
*G01R 27/20* (2006.01)

(52) U.S. Cl.
CPC .......... *G01R 27/205* (2013.01); *G01R 27/08* (2013.01)

(58) Field of Classification Search
CPC .. G01R 27/205; G01R 27/08; G01R 31/2601; G01R 31/2632; G01R 31/2635; G01R 31/2648; G01R 31/2656; G01R 31/2831
See application file for complete search history.

(56) References Cited

U.S. PATENT DOCUMENTS 3,676,775 A * 7/1972 Dupnock ............. G01N 27/041
324/717
6,201,401 B1 * 3/2001 Hellemans ......... G01R 31/2648
257/E21.531

(Continued)

FOREIGN PATENT DOCUMENTS

| CN | 101231317 | 7/2008 |
|---|---|---|
| CN | 103792392 | 5/2014 |
| CN | 104156526 | 11/2014 |

OTHER PUBLICATIONS

Puntambekar K.P. et al., "Surface Potential Profiling and Contact Resistance Measurements an Operating Pentacene Thin-Film Transistors by Kelvin Probe Force Microscopy", Appl. Phys. Lett, vol. 83, No. 26, pp. 5639-5541, 2003; Abstract enclosed.

(Continued)

*Primary Examiner* — Thang X Le
(74) *Attorney, Agent, or Firm* — Hamre, Schumann, Mueller & Larson, P.C.

(57) ABSTRACT

A method for obtaining a contact resistance of a planar device includes: obtaining a contact resistance of a planar device by using a potential measurement method, in the measurement of the surface potential distribution, the planar device is in a state of current flowing, a certain voltage drop is formed at a junction area of the device; extracting the voltage drop measured through the Kelvin microscope by using a linear fitting method; and dividing the measured voltage drop by the current flowing through the device, thereby accurately calculating the magnitude of the contact resistance at the junction area of the planar device. With the present invention, the contact resistance of the planar device can be precisely measured, which is suitable for the contact resistance measurement experiments of devices such as thin film transistors and diodes. The invention has the advantages of reasonable theory, accurate result, simple and easy opera- (Continued)

tion, and is favorable for optimizing the device performance and establishing a complete electrical model of the device.

11 Claims, 7 Drawing Sheets

(56) References Cited

U.S. PATENT DOCUMENTS

| | | | | |
|---|---|---|---|---|
| 2013/0046496 A1* | 2/2013 | Chen | ............... | H05B 31/00 |
| | | | | 702/65 |
| 2015/0061714 A1* | 3/2015 | Kelly-Morgan | ....... | G01N 27/00 |
| | | | | 324/754.11 |
| 2016/0377651 A1* | 12/2016 | Hirota | ............... | G01Q 60/30 |
| | | | | 850/1 |

OTHER PUBLICATIONS

International Search Report, issued in the corresponding PCT application No. PCT/CN2015/098834, dated Aug. 29, 2016, 6 pages.
International Search Report and Written Opinion, issued in the corresponding PCT application No. PCT/CN2015/098834, dated Aug. 29, 2016, 8 pages.
Chinese Office Action, issued in the corresponding Chinese patent application No. 201510993661.3, dated Nov. 11, 2017, 16 pages.
Second Chinese Office Action, issued in the corresponding Chinese patent application No. 201510993661.3, dated Aug. 14, 2018, 8 pages.

* cited by examiner

METHOD FOR OBTAINING A CONTACT RESISTANCE OF A PLANAR DEVICE

TECHNICAL FIELD

The present invention relates to a field of semiconductor element measurement, and more particularly to a method for obtaining a contact resistance of a planar device.

BACKGROUND

An organic, oxide, grapheme, $MoS_2$, LTPS and other disordered semiconductor device with advantages, such as low-cost, flexible, transparent, large-area manufacturing, etc., has broad application prospects. After several years of development, theory of an organic and oxide semiconductor device has gradually become mature. And as the device performance continues to improve, a low-end application product such as a flexible, transparent, printable RFID tag, a radio frequency identification card and a flat panel display driver has entered the domestic and international markets. An organic, oxide, $MoS_2$, LTPS and grapheme thin-film transistors and diodes are core components of a flexible, transparent electronic circuit. Their device performance is constantly improved and their device mobility can reach 0.1~150 $cm^2/Vs$. However, impact of a contact resistance has been to restrict their performance to further improve. Therefore, it is important to accurately measure the contact resistance of the device.

The impact of the contact resistance to the device performance and the circuit performance must be considered when designing the thin film transistor and the diode based integrated circuit. In addition, a process condition must be considered in a device fabrication procedure to optimize the device's contact resistance. Therefore, for a laboratory worker, how to achieve an accurate measurement of the device contact resistance is of great significance.

SUMMARY

In view of shortcomings of the prior art, a main object of the present invention is to provide a method for obtaining a contact resistance of a planar device by using a potential measurement method. The method measures a surface potential distribution of the planar device by using a Kelvin microscope, extracts a contact voltage drop at a junction area from the surface potential distribution diagram, which is divided by the current flowing to obtain the magnitude of the contact resistance.

In order to achieve the above object, the present invention provides a method for obtaining a contact resistance of a planar device, comprising following steps:

producing a planar device;

measuring a travelling surface potential distribution of the planar device, wherein, the planar device is in the state of current flowing, a certain voltage drop is formed at a junction area of the device, dividing the measured voltage drop by the current flowing through the device, thereby accurately calculating the magnitude of the contact resistance at the junction area of the planar device;

wherein the measuring a travelling surface potential distribution of the planar device is implemented through a Kelvin microscope in a potential scan mode.

It can be seen from the above technical solution that the contact resistance obtaining method of the present invention has following beneficial effects:

(1) with the present invention, by measuring the surface potential distribution of the planar device using a Kelvin microscope, the contact resistance between source/drain electrodes and the channel region of a planar TFT and the contact resistance between an electrode and a semiconductor layer of a diode device can be quickly and accurately obtained; the method is simple with a good physical basis;

(2) with the present invention, by utilizing the obtained contact resistance of the planar device, the relationship between the contact resistance and an applied voltage, structure and size of the device can be conveniently examined, which is benefit for the device designer to design the device with the lowest contact resistance and the best performance;

(3) with the present invention, the contact resistance of the planar device can be precisely calculated, which is suitable for modeling of the device. The method of the present invention has the advantages of reasonable theory, accurate result and simple and convenient operation, which is benefit for optimizing the device performance and establishing a complete device electrical model.

DETAILED DESCRIPTION

To make the objectives, technical solutions, and advantages of the present invention more apparent, the present invention is further described in detail below taken conjunction with the specific embodiment with reference to the accompanying drawings.

The present invention discloses a method for obtaining a contact resistance of a planar device, comprising the following steps:

producing a planar device;

measuring a travelling surface potential distribution of the planar device, wherein, the planar device is in the state of current flowing, a certain voltage drop is formed at a junction area of the device, dividing the measured voltage drop by the current flowing through the device, thereby accurately calculating the magnitude of the contact resistance at the junction area of the planar device.

Preferably, the measuring a travelling surface potential distribution of the planar device is implemented through a Kelvin microscope in a potential scan mode.

Preferably, the planar device is a device in which various heterogeneous materials are formed on the same plane and the contact junction is perpendicular to the plane. For example, the planar device is a planar transistor, such as a planar diode, a planar field-effect transistor and the like. Further preferably, the planar transistor is a transistor that includes a gate and one layer of a gate insulating material in a longitudinal direction of the device. Alternatively, the planar transistor is a planar diode in which a high resistance material is used as a substrate. The heterogeneous material comprises different materials forming an ohmic contact.

Preferably, the producing a planar device comprises using masking technology on the substrate, growing one kind of a material, and then growing other materials.

Preferably, the measured voltage drop is the voltage drop obtained by determining the junction area location of the device through a linear fitting method, extracting the voltage drop in the junction area of the device from the surface potential diagram measured through a Kelvin microscope, wherein, the linear fitting method determines the junction area location of the device, i.e., linearly coincident location, through straight linear fitting.

Preferably, the current flowing through the device comprises a current value recorded by an ammeter in an external circuit of the device.

Figure 1:
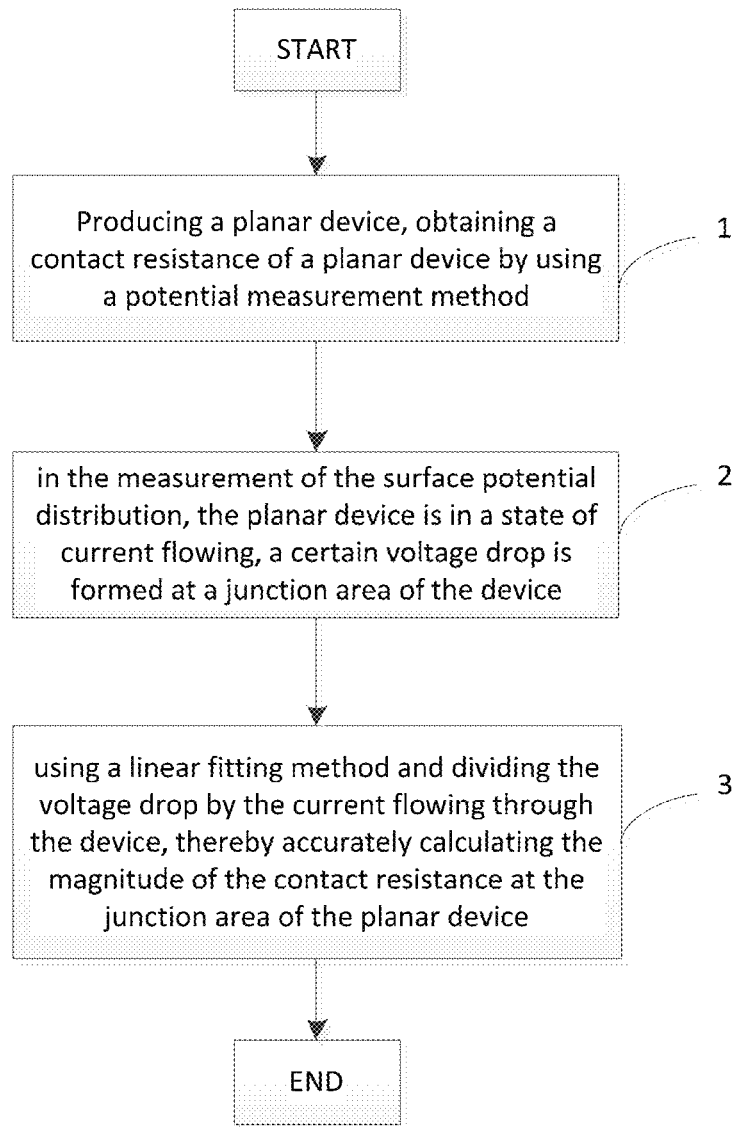
FIG. 1 is the flow chart of a method for obtaining the contact resistance of a planar device.
Figure 2:
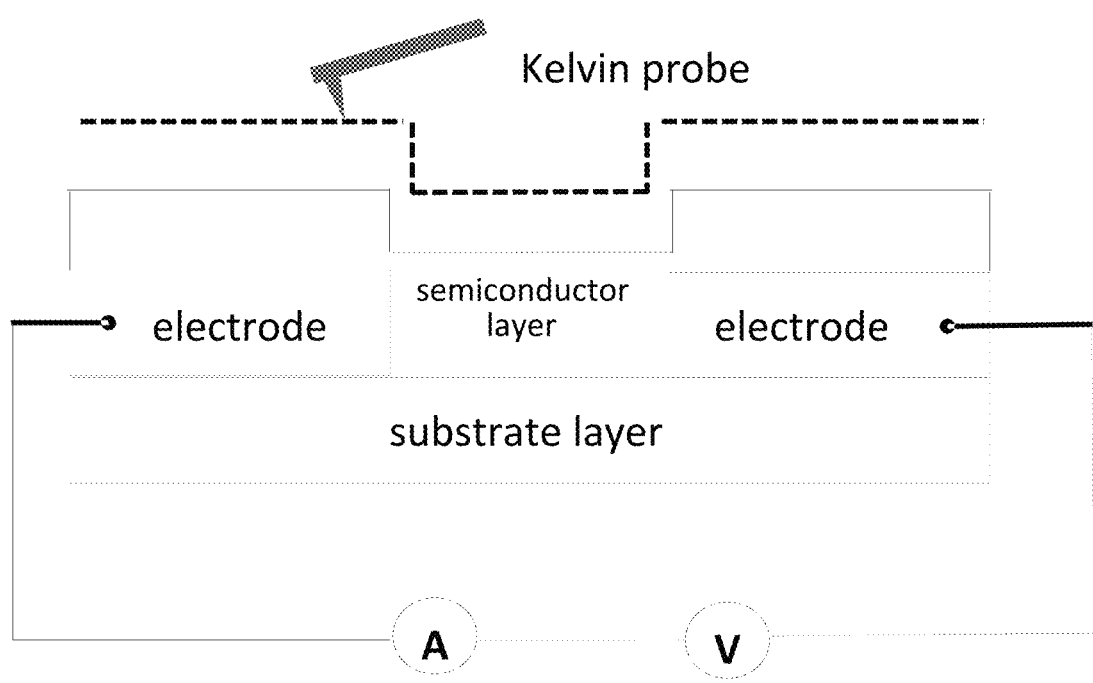
FIG. 2 is the planar device structure diagram and the schematic diagram of a contact resistance measurement experiment.
Figure 3:
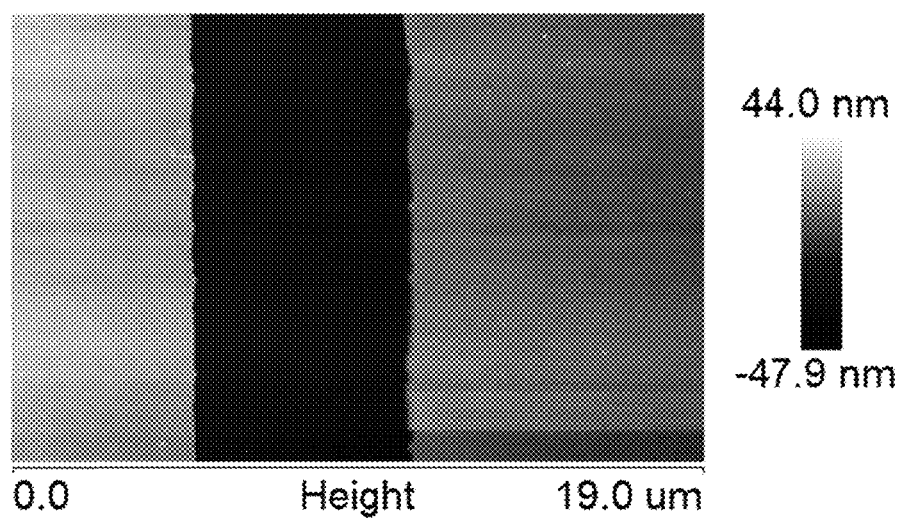
FIG. 3 is the surface topography diagram of the planar device scanned by a Kelvin microscope.
Figure 4:
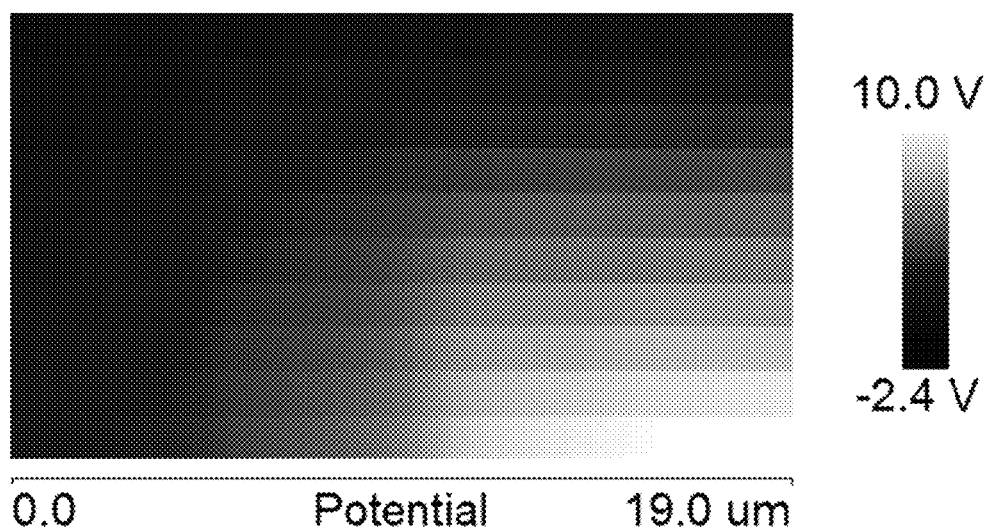
FIG. 4 is the potential distribution diagram of the planar device measured in different working conditions by a Kelvin microscope.
Figure 5:
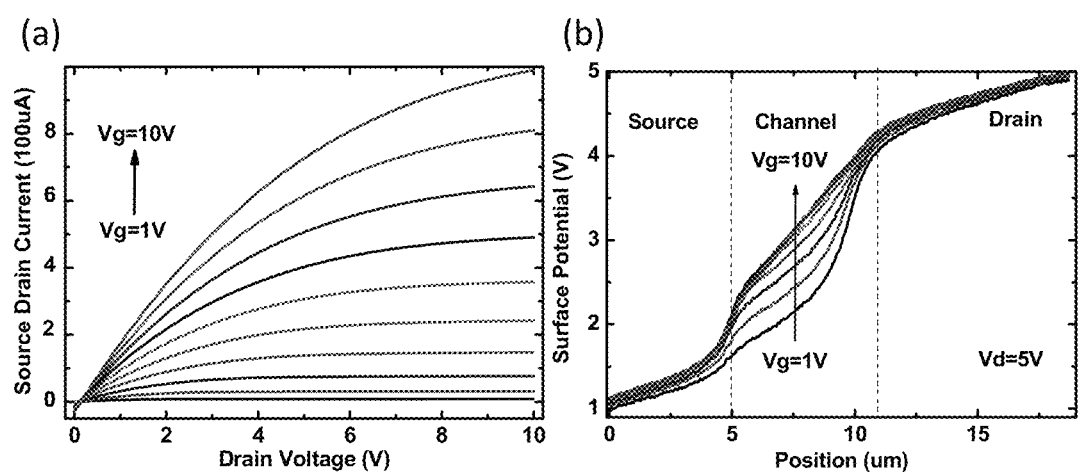
FIGS. 5(a) and 5(b) are planar device electrical test results and Kelvin microscope potential test results, respectively.
Figure 6:
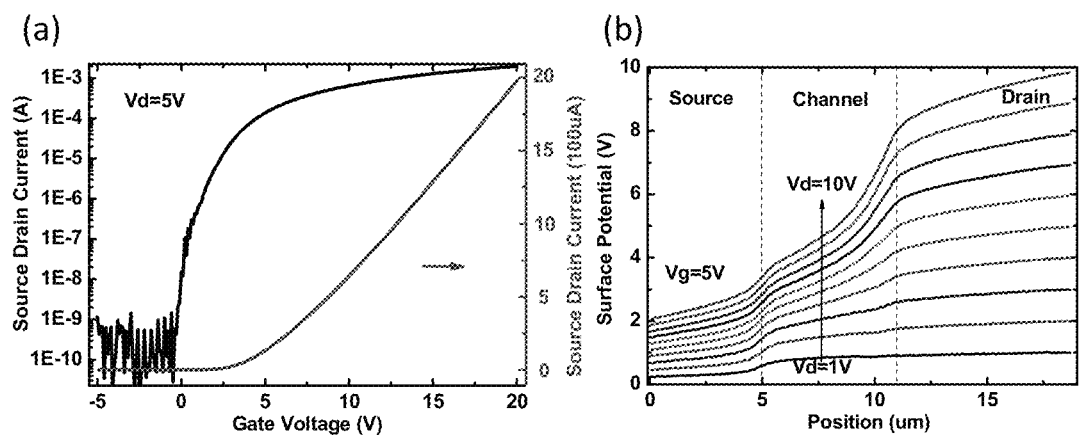
FIGS. 6(a) and 6(b) are planar device electrical test results and Kelvin microscopy potential test results, respectively.
Figure 7:
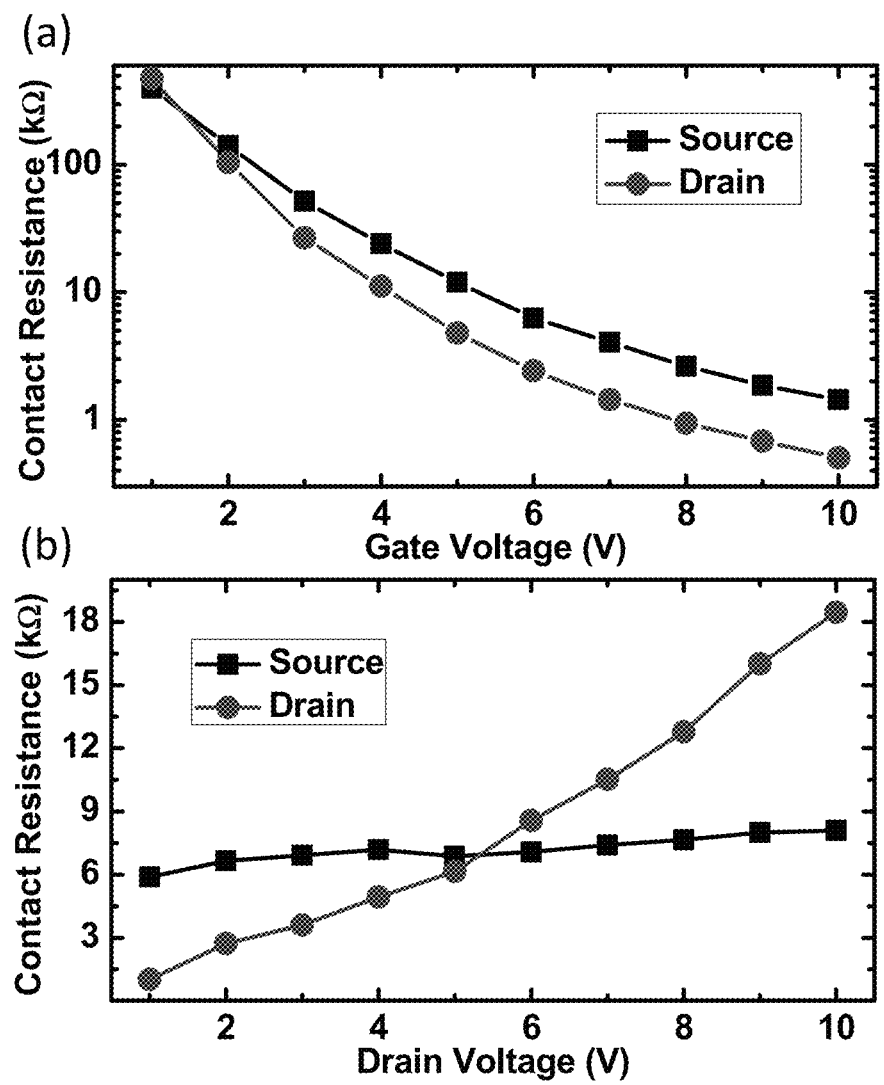
FIGS. 7(a) and 7(b) are graphs of the contact resistance and the gate terminal voltage and drain terminal voltage of the planar device calculated by the method of the present invention, respectively.

As a preferred embodiment of the present invention, as shown in FIG. 1, the method for obtaining a contact resistance of a planar device of the present invention includes the following steps:

step 1: producing a planar device; a device structure diagram and a contact resistance measurement experiment schematic diagram are shown in FIG. 2; a morphology of the device scanned by a Kelvin microscope is shown in FIG. 3; a certain voltage is applied by a constant voltage source to the device and a device current is tested, while the Kelvin microscopy at this time measures the device surface potential distribution;

step 2: measuring a travelling surface potential distribution of the planar device, wherein, the planar device is in the state of current flowing, a certain voltage drop is formed at a junction area of the device; a potential distribution diagram of the planar device measured in different working conditions by the Kelvin microscope is shown in FIG. 4; planar device electrical test results and Kelvin microscope potential test results are shown FIGS. 5 and 6;

step 3: extracting the voltage drop measured by the Kelvin microscope by using a linear fitting method, that is, determining the junction area location of the device utilizing one straight linear fitting, in which, the linearly coincident location should be the junction area location, and dividing the voltage drop by the current flowing through the device, thereby accurately calculating the magnitude of the resistance at the junction area location of the planar device, as shown in FIG. 7.

Utilizing the method provided above that obtains a contact resistance of a planar device by using a potential measurement method, the present invention can measure the magnitude of the contact resistance of the planar device in different material growth conditions and in different material contacts, thereby providing the device designer with an optimized device structure and performance guidance.

The above specific embodiments are used to further describe the objectives, technical solutions, and beneficial effects of the present invention in detail. It should be understood that the above description is only the specific embodiments of the present invention and is not intended to limit the present invention. Any modifications, equivalent substitutions and improvements made within the spirit and principle of the present invention should be included in the protection scope of the present invention.

What is claimed is:

1. A method for obtaining a contact resistance of a planar device, comprising following steps:
producing the planar device;
measuring a travelling surface potential distribution of the planar device, wherein, the planar device is in the state of current flowing, a certain voltage drop is formed at a junction area of the device, dividing the measured voltage drop by the current flowing through the planar device, thereby accurately calculating the magnitude of the contact resistance at the junction area of the planar device.

2. The method for obtaining a contact resistance of a planar device according to claim 1, wherein the measuring of the travelling surface potential distribution of the planar device is implemented through a Kelvin microscope in a potential scan mode.

3. The method for obtaining a contact resistance of a planar device according to claim 1, wherein the planar device is a device in which various heterogeneous materials are formed on the same plane and the contact junction is perpendicular to the plane.

4. The method for obtaining a contact resistance of a planar device according to claim 3, wherein the planar device comprises a planar transistor.

5. The method for obtaining a contact resistance of a planar device according to claim 4, wherein the planar transistor is a transistor that includes a gate and one layer of a gate insulating material in a longitudinal direction of the planar device.

6. The method for obtaining a contact resistance of a planar device according to claim 3, wherein the planar device comprises a planar diode that uses a high-resistance material as a substrate.

7. The method for obtaining a contact resistance of a planar device according to claim 1, wherein the producing a planar device comprises using masking technology on a substrate, growing one kind of a material, and then growing other materials.

8. The method for obtaining a contact resistance of a planar device according to claim 1, wherein the measured voltage drop is the voltage drop of the junction area of the planar device obtained by determining the junction area location of the planar device through a linear fitting method and extracting the voltage drop in the junction area of the planar device from the surface potential diagram measured through a Kelvin microscope.

9. The method for obtaining a contact resistance of a planar device according to claim 8, wherein the linear fitting method determines the junction area location of the planar device, that is a linearly coincident location, through a straight linear fitting method.

10. The method for obtaining a contact resistance of a planar device according to claim 1, wherein the current flowing through the planar device comprises a current value recorded by an ammeter in an external circuit of the planar device.

11. The method for obtaining a contact resistance of a planar device according to claim 3, wherein the heterogeneous material comprises different materials forming an ohmic contact.

* * * * *